United States Patent [19]

Mathias et al.

[11] Patent Number: 4,468,717
[45] Date of Patent: Aug. 28, 1984

[54] APPARATUS FOR COOLING INTEGRATED CIRCUIT CHIPS

[75] Inventors: Joseph S. Mathias, Riverton, N.J.; Faquir C. Mittal, Audubon, Pa.

[73] Assignee: Sperry Corporation, New York, N.Y.

[21] Appl. No.: 386,484

[22] Filed: Jun. 9, 1982

[51] Int. Cl.³ .............................................. H05K 7/20
[52] U.S. Cl. .................................. 361/382; 361/385; 361/386; 165/104.33; 357/82
[58] Field of Search .............. 174/16 HS; 165/104.33, 165/80 C, 80 E; 357/82; 361/385, 386, 415, 384, 395, 399, 382, 383

[56] References Cited

U.S. PATENT DOCUMENTS 4,138,692  2/1979  Meeker ................................. 357/82
4,156,458  5/1979  Chu ...................................... 165/81
4,203,129  5/1980  Oktay ................................... 357/82

OTHER PUBLICATIONS

Lifshey et al., "Heat Sink Using Retractable Bellows", IBM Tech. Discl. Bull., vol. 23, No. 7A, Dec. 1980, p. 2905.

Primary Examiner—G. P. Tolin
Attorney, Agent, or Firm—James R. Bell; Marshall M. Truex

[57] ABSTRACT

A multichip thermal conduction module has improved cooling in a housing having at least one board mounted therein including a plurality of chips on the board. A heat conducting plate is mounted in the housing adjacent the chips. A cold plate abuts heat conducting plate and includes an inlet an outlet connected to a coolant passage formed therein for guiding a coolant through the housing. Flexible heat conductors are connected to the heat conducting plate and are urged into aligned contact with the chips for conducting heat therefrom. The flexible conductors are in fluid communication with the cold plate passage for conducting coolant adjacent the chips.

3 Claims, 3 Drawing Figures

APPARATUS FOR COOLING INTEGRATED CIRCUIT CHIPS

BACKGROUND OF THE INVENTION

1. Field of the Invention

This invention relates generally to heat exchange of an electrical article and more particularly to cooling a module containing a plurality of integrated circuit chips.

2. Description of the Prior Art

The temperature of integrated circuit chips must be kept below specified limits to ensure proper function, reliability and useful life. The trend in integrated circuit technology is to pack more circuits per chip which increases the heat generation per chip. Also, system designers are mounting chips closer together to minimize propagation delays in the interconnections. These trends and designs have increased heat flux, i.e. power per unit area, and caused a need for new cooling techniques.

In the conduction cooling of heat producing elements, a conductive heat transfer medium (a solid) is placed into contact with a heat producing element. The medium either has, or contacts another element which has, a greater surface area relative to the heat producing element so that heat is more easily dissipated from the greater surface area. To enhance heat dissipation from surface areas, a fluid is often used as a heat transfer medium by being moved over the heat dissipating surface area to "carry away" heat by convection. From the foregoing it becomes quite clear that heat transfer is enhanced when there is greater surface contact between a heat producing element and a heat transfer medium.

The development of multichip thermal conduction modules to enhance the cooling of concentrations of chips resulted in various conduction cooling techniques including a plurality of resiliently urged pistons each contacting a chip and providing a thermal path to a portion of the module housing which is convection cooled by a fluid coolant.

This technique was further enhanced by encapsulating the pistons in Helium gas to promote conduction cooling. Also, coolants such as air, water and fluorocarbons have been pumped through the housings.

Such pistons limit heat transfer regardless of piston geometry dxe to the rigidity of the piston. For example, if the piston has a curved contact surface then limited point contact with the relatively planar chip surface results in reduced heat transfer. Where the piston also has a relatively planar contact surface, the piston and chip contact surfaces must be in substantial alignment to avoid point contact.

A major problem of present day liquid cooling systems is the need for external plumbing to be connected to processor cabinets, and the like, the need for a special fluid pumping system, and the difficulties involved in repairing damaged boards because of such fluid connections.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing an apparatus for cooling integrated circuit chips including a housing having at least one board mounted therein and a plurality of chips on the board. The chips each have a substantially planar surface extending into the housing. A heat conducting plate is mounted in the housing adjacent the chips. A cold plate is mounted in the housing in abutment with the heat conducting plate. The cold plate has a fluid coolant passage formed therein for guiding a coolant through the housing. Flexible conductors are connected to the heat conducting plate for conducting heat from the chips. The conductors are in fluid communication with the passage for containing the fluid coolant. A coolant coil is connected to the cold plate and means are provided for urging fluid coolant through the coil and cold plate.

The foregoing and other aspects will become apparent from the following detailed description of the invention when considered in conjunction with the accompanying drawings. It is to be expressly understood, however, that the drawings are not intended as a definition of the invention but are for the purpose of illustration only.

DESCRIPTION OF THE PREFERRED EMBODIMENT

Figure 1:
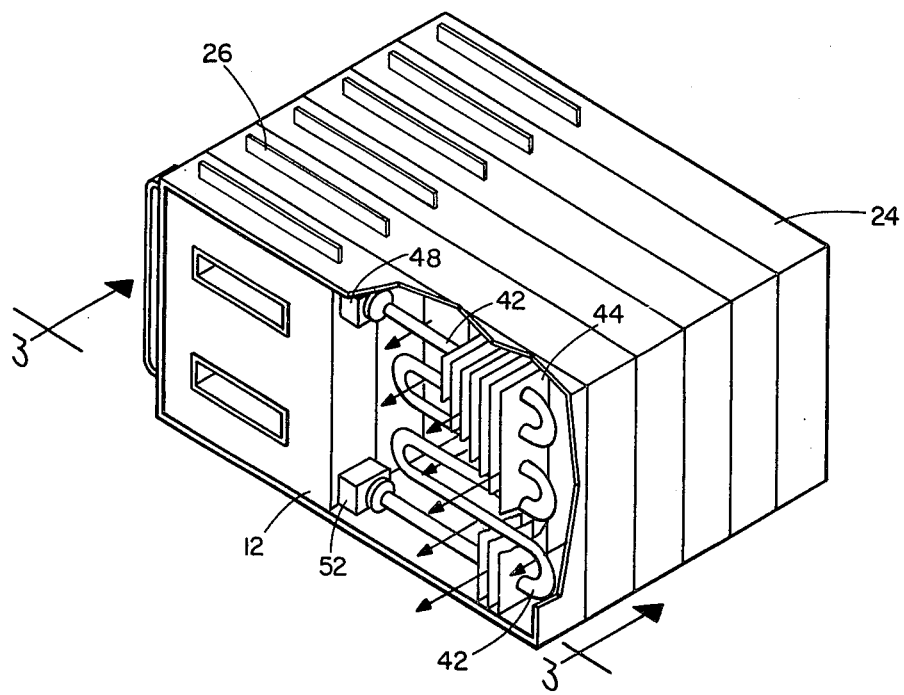
FIG. 1 is a perspective view with a part broken away illustrating an embodiment of a plurality of modular cooling housings assembled into a multimodular unit.

An apparatus for cooling integrated circuit chips is illustrated in the drawing Figures and comprises a thermal conduction module generally designated 10. Module 10 includes a housing assembly 12 including a cold plate 14 abutting a heat conducting plate 16. A board 18 including a plurality of chips 20 is adjacent plate 16 and is spaced therefrom by housing portions 12a. Board 18 is supported by a housing cover 22. Flexible means such as bellows 34 are attached to cold plate 14. Module 10, FIG. 2 can be constructed to include cold plate 14. Each module 10 includes a closed loop coolant coil connected to circulate a fluid coolant through cold plate 14, as will be discussed below in greater detail. Also, a multimodular unit 24, FIG. 1, can include a plurality of modular housings 12, each having an individual electrical connector 26.

Figure 2:
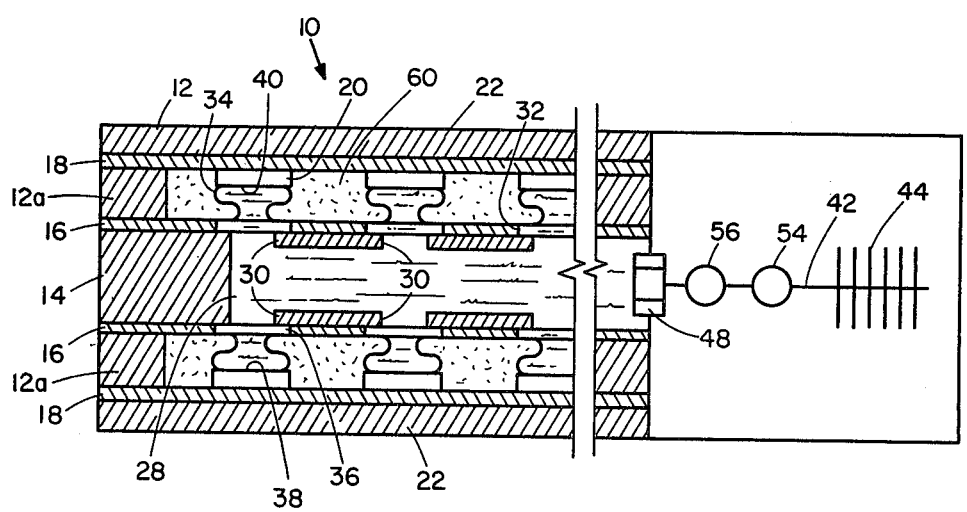
FIG. 2 is a view of one of the housings taken from line 2—2 of FIG. 3.

Cold plate 14, FIG. 2, is formed of Aluminum, or other suitable material, and has a fluid coolant passage 28 formed therein for guiding coolant through housing 12. A plurality of apertures 30 are formed in fluid communication with passage 28.

Board 18 and associated chips 20 are well known and each chip 20 includes a substantially planar surface 40 extending into a cavity 60 of housing 12.

Heat conducting plate 16 is of Copper, or other suitable material, and includes a plurality of apertures 32 in alignment with apertures 30 providing fluid coolant access to bellows 34.

Bellows 34 are formed of Nickel, Beryllium Copper, or other suitable material and are soldered, brazed or otherwise suitably connected at a first open end 36 to heat conducting plate 16 at aperture 32. A second closed end 38 is substantially planar for being urged into aligned surface-to-surface contact with planar surface 40 of chip due to the inherent flexibility or axial and angular compliance of bellows 34. In this manner, bellows 34 conducts heat away from chip 20.

Housing cover 22 is of Aluminum, or other suitable material, and retains cold plate 14, heat conducting plate 16 and board 18 in their relative positions.

Figure 3:
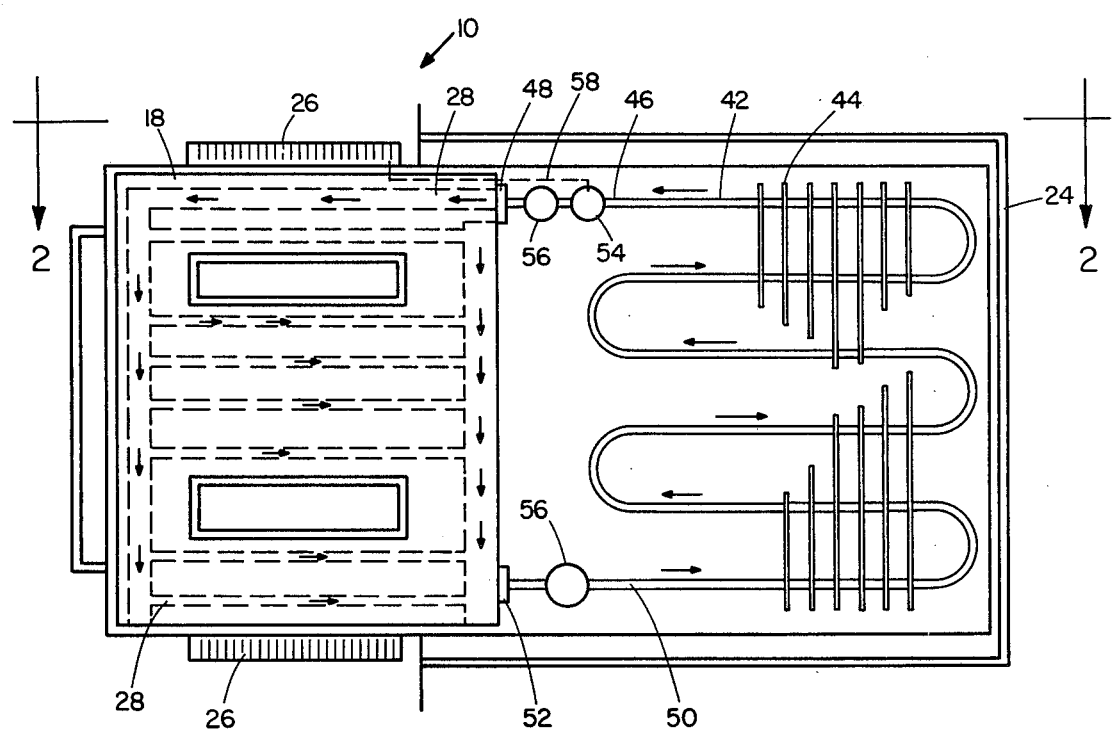
FIG. 3 is a view taken from line 3—3 of FIG. 1.

A coolant coil 42, of Copper, Aluminum, or other suitable material is connected in fluid communication with cold plate 14, FIG. 3 and heat conducting fins 44, also of a suitable material, are connected to coil 42. Thus coil 42 and fins 44 comprise a heat exchanger. A first end 46 of coil 42 connects to an inlet 48 of passage 28 and a second end 50 of coil 42 connects to an outlet 52 of passage 28. Fins 44 can be cooled with natural or forced air convection. In this manner, each module 10 includes a closed loop coolant coil 42 connected to cold plate 14 at inlet and outlet 48, 52, respectively, obviating the need for external plumbing.

A well known, solid state pump 54, including a one-way check valve 56, interconnects first end 46 of coil 42 and inlet 48 as a means for urging a coolant, in this case water, through passageway 28. Another of the well known, one-way check valves 56 interconnects outlet 52 and second end 50 of coil 42 to assure the desired movement of the fluid coolant.

A graphically represented electrical connection 58 can interconnect pump 54 with connector 26 and/or board 18 for providing power to drive pump 54.

If desired, an inert fluid such as Helium can be placed in cavity 60 to enhance cooling of chips 20.

In operation, heat is conducted from chips 20 to bellows 34. Thermal convection in bellows 34 and passage 28 is enhanced by a heat exchanger in the form of a coil 42 having fluid moved therethrough by a pump 54. Fins 44 are connected to aid in cooling fluid in coil 42 due to natural or forced air convection across fins 44.

Advantageously, boards 18 can be changed without the need to disturb or handle the self-contained fluid coolant. An individual module 10 can be replaced by another similar module 10 without the need to manipulate external fluid connections. The coolant can be circulated at a relatively low pressure. A separate unit is not required for pumping and cooling the fluid coolant. Bellows 34 provides a heat transfer medium which is axially and angularly compliant with the chip surface. Thus there is a substantial increase in surface area contact between the medium and the hot chip.

The foregoing has described an improved apparatus for cooling integrated circuit chips.

It is anticipated that aspects of the present invention, other than those specifically defined in the appended claims, can be obtained from the foregoing description and the drawings.

Having thus described the invention, what is claimed is:

1. An integrated circuit chips cooling module comprising:

a housing;

a cold plate in the housing forming a fluid coolant passage having an inlet and an outlet;

a pair of opposed heat conducting plates abutting said cold plate and spaced apart thereby, said heat conducting plates being adjacent said passage and including apertures in fluid communication with said passage;

a board associated with each heat conducting plate and spaced therefrom by a portion of said housing defining a cavity between each board and said respective heat conducting plate;

chips mounted on each board and extending into an adjacent one of the cavities;

bellows connected to each of said heat conducting plates in fluid communication with each aperture, said bellows extending into an adjacent one of the cavities in flexible abuttment with an associated chip;

a coolant coil having a self-contained coolant therein, said coil having a first end connected to said inlet and a second end connected to said outlet;

means connected with said coil for urging said coolant through said passage; and one-way check valves connected to said coil respectively adjacent said inlet and said outlet.

2. The apparatus of claim 1 including:
   a plurality of fins connected to said coil.

3. The apparatus of claim 1 including:
   an inert fluid in each of said cavities.

* * * * *